United States Patent [19]
Kim

[11] Patent Number: 6,092,713
[45] Date of Patent: Jul. 25, 2000

[54] AUTOMATED STACKING AND SOLDERING APPARATUS FOR THREE DIMENSIONAL STACK PACKAGE DEVICES AND MANUFACTURING METHOD THEREOF

[75] Inventor: Jae June Kim, Seoul, Rep. of Korea

[73] Assignee: Samsung Electronics Co., Ltd., Suwon, Rep. of Korea

[21] Appl. No.: 09/019,202

[22] Filed: Feb. 5, 1998

[30] Foreign Application Priority Data

Feb. 17, 1997 [KR]  Rep. of Korea ..................... 97-4680

[51] Int. Cl.⁷ ............................................. B23K 31/00
[52] U.S. Cl. ............................. 228/180.21; 228/179.1; 228/44.3
[58] Field of Search ............................. 228/180.21, 179.1, 228/44.3

[56] References Cited

U.S. PATENT DOCUMENTS 3,094,093  6/1963  Zimmerman ........................... 113/126
5,236,117  8/1993  Roane et al. ........................ 228/180.21
5,963,426  10/1999  Hayden et al. ........................ 361/704

*Primary Examiner*—Gregory Mills
*Assistant Examiner*—M. Alexandar Elve
*Attorney, Agent, or Firm*—Jones Volentine, L.L.C.

[57] ABSTRACT

An automated apparatus for three dimensional stack package devices provides mass production of J-lead type stack packages. The apparatus includes a package loader and a package loader/unloader for loading upper and lower individual packages and for unloading packages which have been stacked and soldered; an indexing system for receiving and aligning the upper and lower individual packages and for transporting the stacked upper and lower packages, an applying unit for applying a solder flux or a solder paste to metal leads of the upper individual packages, first and second transfer tools for transferring the individual packages to the applying unit and to the indexing system; and a heating unit for heating the stacked upper and lower packages so that metal leads of the upper and lower packages are solder jointed.

15 Claims, 15 Drawing Sheets

AUTOMATED STACKING AND SOLDERING APPARATUS FOR THREE DIMENSIONAL STACK PACKAGE DEVICES AND MANUFACTURING METHOD THEREOF

BACKGROUND OF THE INVENTION

1. Field of the Invention

The present invention generally relates to the manufacture of three dimensional stack package devices, and more particularly, to an automated stacking and soldering apparatus and a manufacturing method for three dimensional stack package devices.

2. Background of the Related Art

As the integration of semiconductor IC devices increases and IC devices become larger, there is a need to enhance their mounting density. To meet this need, three dimensional stacking technologies have been developed and widely employed in assembly processes by semiconductor manufacturers. In a three dimensional stack package, several unpackaged bare chips or packaged chips are vertically stacked. In this technology, it is very important to properly interconnect the stacked chips both electrically and physically. A soldering interconnection, in particular, a reflow soldering interconnection, is most widely used for the vertical interconnection of the stacked chips.

The reflow soldering technique uses a soluble metal. Devices to be joined are fixed, and then the joining areas are heated so that the metal is melted and the solder is joined. The composition used in the reflow soldering may be a tin-lead (Sn—Pb) alloy or a tin-lead-silver (Sn—Pb—Ag) alloy in which a minute amount of silver is added. The reflow soldering technique is classified as either a vapor phase reflow soldering, an infrared reflow soldering, or a hot air reflow soldering, based upon the type of heat transfer mechanism used in the joining areas.

A conventional reflow soldering apparatus, for example as disclosed in U.S. Pat. No. 5,236,117, is shown in FIGS. 1A and 1B. A stacked package 12 to be soldered is plated with a flux and then fixed to the left end 10a of an impact arm 10. Metal outer leads 13 on the lower side of the package are heated to a certain temperature and dipped into a molten solder fountain 8. The impact arm 10 is pivotally mounted on pivot assembly 6, which allows the left end 10a of the impact arm holding the package device to move upward and downward. The impact arm 10 is shown in an elevated position in dashed lines and in the lowered position in solid lines in FIG. 1A. When the impact arm 10 moves to its lower position, the outer leads 13 of the package are dipped into the molten solder 11 in the fountain 8. A height stopper 2 is used to set the lowered position of the impact arm. Vibration means 4 vibrates the impact arm 10 in order to prevent solder voids or lack of solder tinning of closely-spaced leads.

With this dipping technique, the solder application can be performed efficiently. However, as the lead pitch gets finer as the package device requires more and more I/O pins, solder bridges may occur thereby causing electrical shorts between the leads. To alleviate these problems, impact weight 9 drops onto the top of the opposite end of the impact arm 10. Therefore, the package device 12 and the impact arm 10 are rapidly returned to the upper position, so that any excess molten solder is removed from the leads. The movement of the impact weight 9 is controlled by an air cylinder 7 which in turn may be controlled by a programmable controller.

In the conventional soldering apparatus the vertically stacked individual packages are loaded onto the apparatus manually. Furthermore, vertical interconnection into three dimensional stack package devices is suitable for J-leaded type individual packages such as SOJ (Small Outline J-bend), TSOJ (Thin SOJ) and PLCC (Plastic Leaded Chip Carrier). Thus, if an automated stacking and soldering apparatus is provided exclusively for production of J-lead type package, mass production of stack package devices is possible.

SUMMARY OF THE INVENTION

The present invention provides a stacking and soldering apparatus which can automatically assemble three dimensional stack package devices in order to improve production yield.

The present invention also provides an automated stacking and soldering apparatus which is exclusively used for a three dimensional stack package device employing J-lead type packages.

To achieve these and other advantages, the present invention provides an automatic stacking and soldering apparatus that includes a package loader for loading a plurality of upper individual packages to be stacked, and a package loader/unloader for loading a plurality of lower individual packages to be stacked and for unloading a plurality of three dimensional stack packages which have been stacked and soldered. An indexing system receives the upper and lower individual packages and transports the stacked upper and lower packages. The indexing system comprises an indexing plate rotating at a constant speed and a plurality of guide fingers, each fixed to the indexing plate and having mounting grooves in which the individual packages are mounted. An applying unit applies a solder flux or a solder paste to metal leads of the upper individual packages. A first transfer tool transfers the lower individual packages loaded by the package loader/unloader to the indexing system, and a second transfer tool transfers the upper individual packages loaded by the package loader to the applying unit and then to the indexing system. A heating unit heats the stacked upper and lower packages transported by the indexing system, so that metal leads of the upper and lower packages are solder jointed.

The indexing system may further comprise a loading shuttle arm for placing and stacking the upper individual packages onto the lower individual packages mounted in the mounting grooves of the guide fingers, and an unloading shuttle arm for removing the stacked and soldered packages from the mounting grooves.

The guide finger comprises a top block and a bottom block forming mounting grooves in which the individual packages are stacked. In the bottom block, horizontal and vertical inside walls are formed. The metal leads of the lower individual packages contact the horizontal inside wall. The vertical inside wall is used to align the individual packages when they are loaded into the mounting grooves by the loading shuttle arm.

The applying unit is used to plate the molten solder flux or the molten solder paste onto metal leads of the upper individual packages. For applying the solder flux or the solder paste, a belt or a metal cam which rotates at a constant speed in the fountain can be used. In order to ensure the amount of flux or paste is uniformly applied, a control guide can be used.

In another aspect, a method for manufacturing three dimensional stack packages according to the present invention comprises the steps of: loading a plurality of lower individual packages to be stacked; transferring the plurality of loaded lower individual packages to a stacking position; loading a plurality of upper individual packages to be stacked; applying a soldering material to metal leads of the plurality of loaded upper individual packages; transferring the plurality of upper individual packages to the stacking position; aligning the transferred lower and upper individual packages, and placing the upper individual packages onto the lower individual packages so that corresponding metal leads of the upper and the lower individual packages contact each other; soldering the corresponding metal leads of the upper and the lower individual packages; and unloading the stacked and soldered packages.

The metal leads of the individual packages are plated with a solder alloy of 85% tin and 15% lead during an outer lead plating process, and molten flux or solder paste is used as the soldering material in the step of applying the soldering material to the metal leads.

The soldering step is carried out in a soldering chamber for heating the metal leads of the upper and the lower individual packages to a soldering temperature. The soldering temperature is maintained by using a hot inert gas which does not contain oxygen. When the temperature within the soldering chamber is set to about 360° C. and the stacked individual packages are controlled to remain for about 100 seconds, three dimensional stack package devices can be manufactured at a rate of about 800 per hour.

The metal leads of the individual packages should be pre-heated below the soldering temperature to prevent the flux or the solder paste from burning out and to prevent damage to the metal leads caused by abrupt heating.

BRIEF DESCRIPTION OF THE ATTACHED DRAWINGS

DETAILED DESCRIPTION OF PREFERRED EMBODIMENT

Figure 1A:
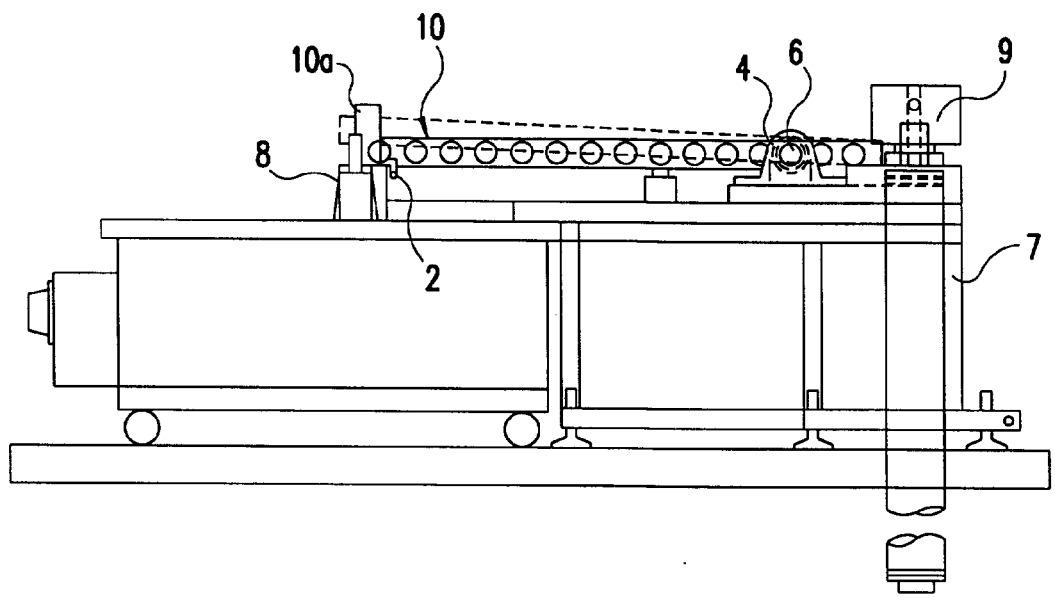
FIG. 1A is a front view of a conventional soldering apparatus.
Figure 1B:
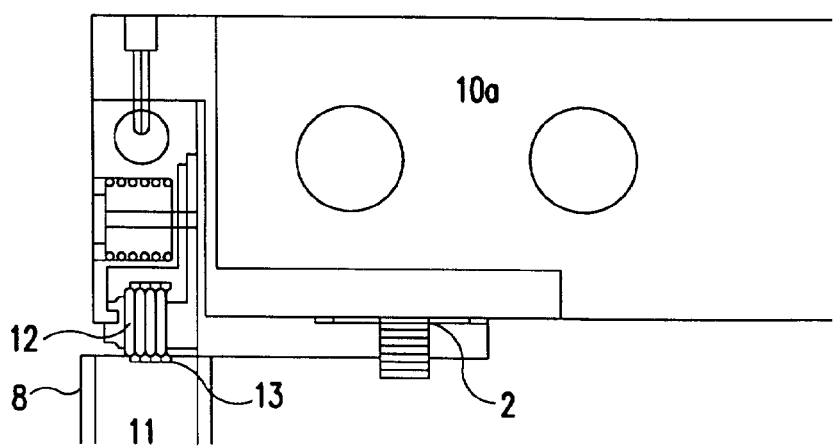
FIG. 1B is a detail view of the left end of the impact arm of the conventional soldering apparatus of FIG. 1A.
Figure 2A:
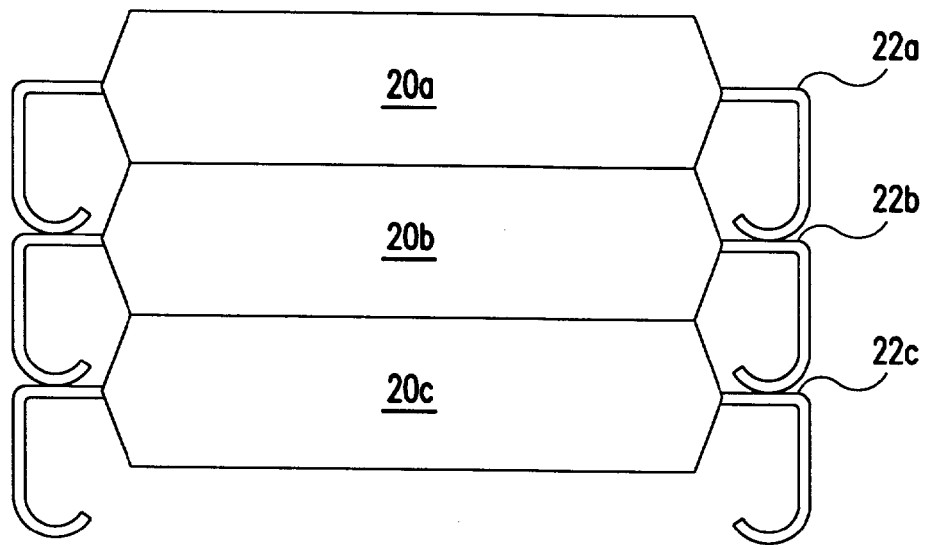
FIGS. 2A and 2B are end views of three dimensional stack packages suitable for use in the present invention.
Figure 2B:
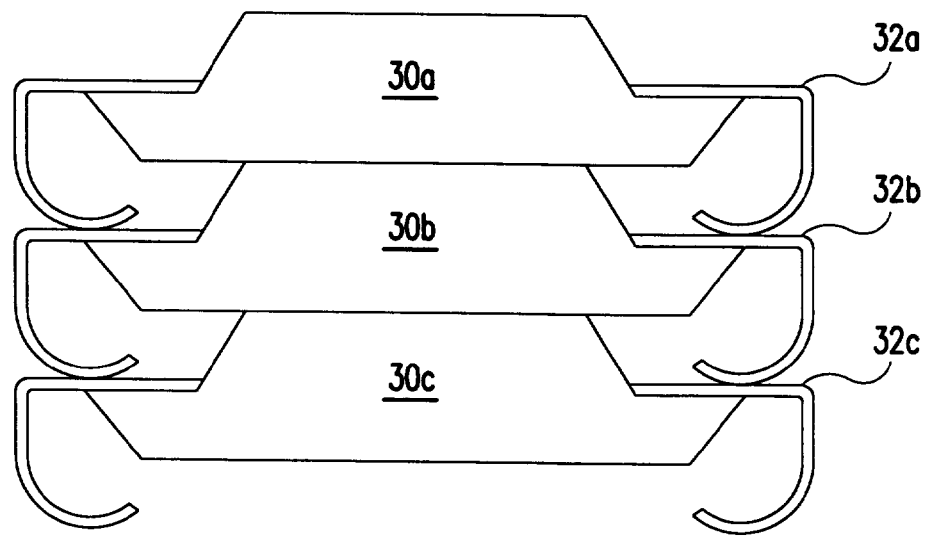
Figure 2C:
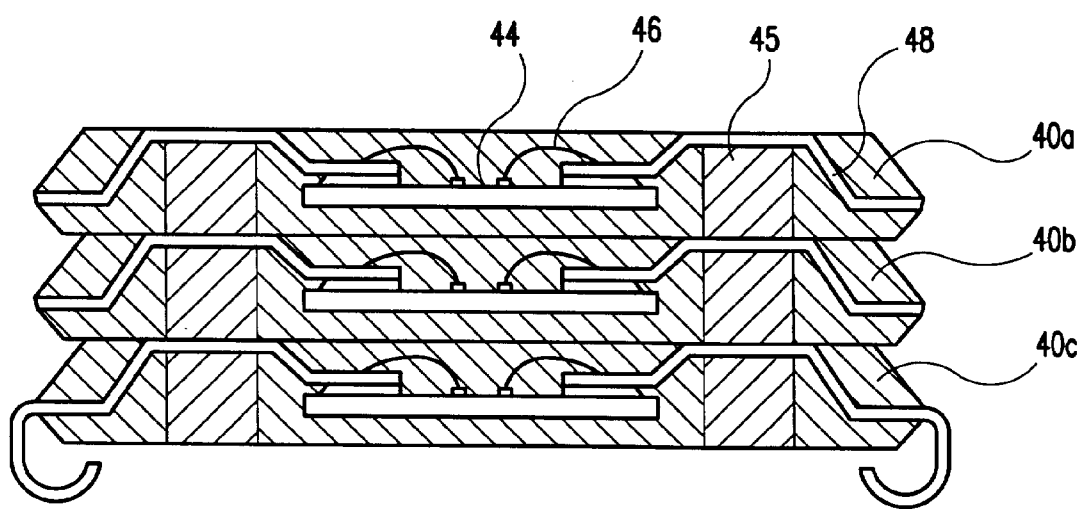
FIG. 2C is a cross-sectional view of another stack package suitable for use in the present invention.

FIGS. 2A and 2B are end views and FIG. 2C is a cross-sectional view of types of three dimensional stack packages. As shown in FIG. 2A, standard J-leaded packages 20a, 20b and 20c are stacked and solder jointed by making metal leads 22a and 22b of upper packages 20a and 20b directly contact shoulders of corresponding metal leads 22b and 22c of lower packages 20b and 20c, and then by soldering the contacting parts.

The standard J-leaded packages can be modified as shown in FIG. 2B, especially for use in a three dimensional stack device. For instance, a part of the package body 30a, 30b and 30c can be removed such that inner lead portions of metal leads 32a, 32b and 32c are partially exposed. In this way, the exposed shoulder of the metal lead comprises a wide area, and the outer leads can be bent further toward the package body while still maintaining the necessary contact with the shoulder, resulting in increased mounting density.

The stack package shown in FIG. 2C is disclosed in commonly-assigned U.S. patent application Ser. No. 08/753, 532 entitled "Three Dimensional Stack Package Device", filed on Nov. 26, 1996, attorney Docket No. SEC.0129. Each of the stacked packages 40a, 40b and 40c comprises vertical interconnection means 45 and coupling lead portions 48, both of which are electrically coupled to adjacent packages within the stacked package. The coupling lead portions 48 are electrically connected to the semiconductor chip 44 via bonding wires 46 and partially exposed to the package body. The vertical interconnection means 45 are exposed to the back surface of the package, so that a soldering joint with the coupling leads of underlying packages 40b and 40c can be accomplished. With this structure, a lead forming process can be omitted for the upper packages 40a and 40b, and the bonding force between the upper and the lower packages is improved.

Figure 3:
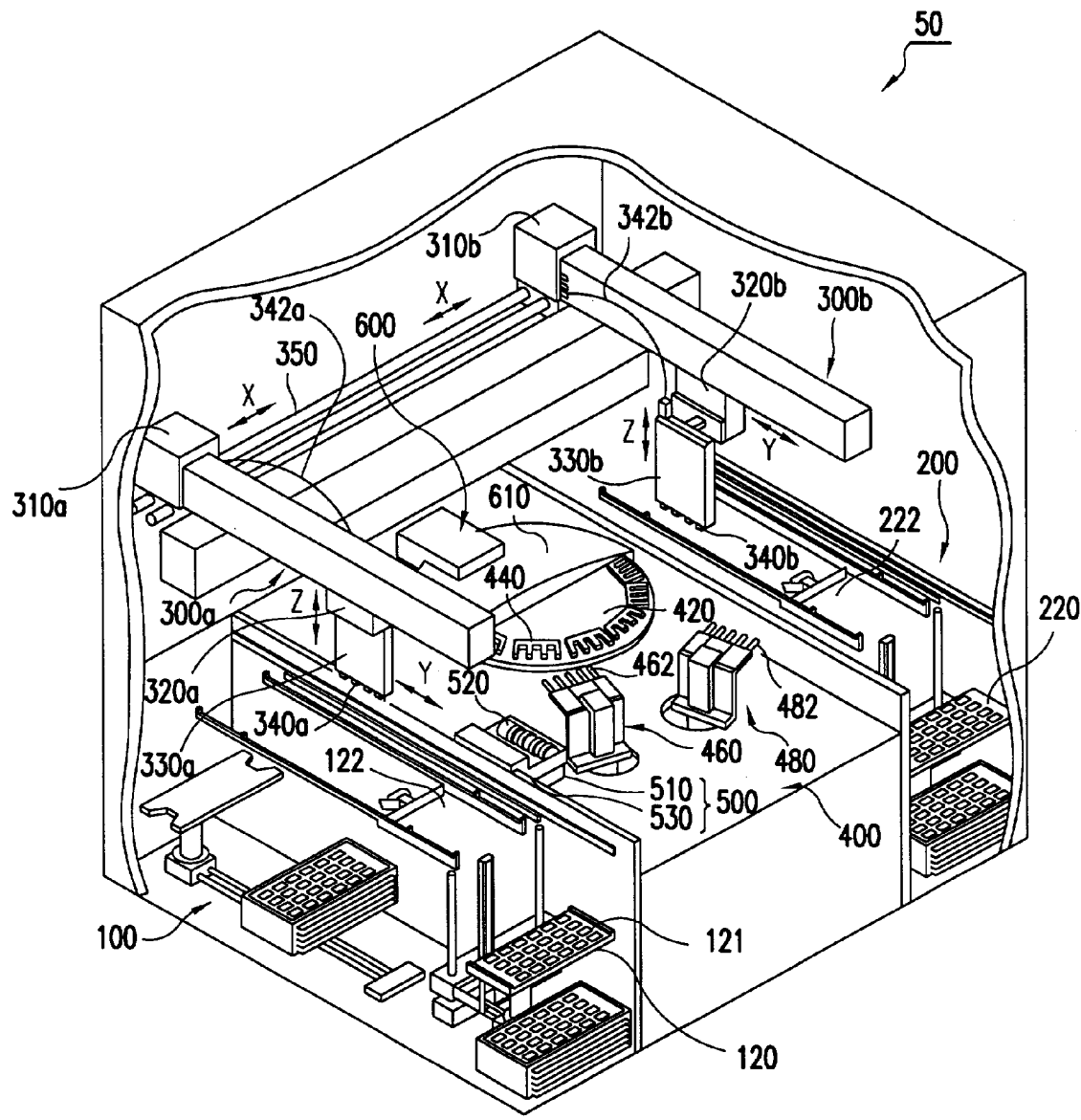
FIG. 3 is a perspective view of an automated stacking and soldering apparatus of the present invention.

These J-leaded packages are automatically stacked and solder jointed by the apparatus of the present invention as shown in FIG. 3. The automated stacking and soldering apparatus comprises a package loader 100, a package loader/unloader 200, first and second transfer tools 300a and 300b, an indexing system 400, a solder flux or solder paste applying unit 500, and a heating unit 600.

Individual packages to be stacked are contained in tray 120 and 220, and are then loaded into a tray unit by the package loader 100 and the package loader/unloader 200. The package loader 100 and the package loader/unloader 200 may have the same construction. However, the package loader 100 is only for loading the individual packages to be stacked, while the package loader/unloader 200 is for both loading the individual packages and unloading the final device after stacking and soldering operations have been completed.

The first and second transfer tools 300a and 300b transfer the individual packages to the indexing system 400. The transfer tools 300a and 300b comprise master arms 310a and 310b rectilinearly moving in the direction indicated by the X arrows along rail 350, slave arms 320a and 320b connected to the master arms 310a and 310b and moving along master arms 310a and 310b in the direction indicated by the Y arrows, and pickup arms 330a and 330b connected to slave arms 320a and 320b for moving upward and downward in the direction indicated by the Z arrows. The pickup arms 330a and 330b each have a plurality of vacuum pads 340a and 340b for picking up the packages. A vacuum is fed to the vacuum pads 340a and 340b through vacuum tubes 342a and 342b.

The indexing system 400 aligns the upper and the lower individual packages to be stacked and makes the corresponding metal leads of the stacked packages directly contact each other. The indexing system 400 comprises an index plate 420 having a plurality of guide fingers 440, a loading shuttle arm 460, and an unloading shuttle arm 480. Holding fingers 462 of the loading shuttle arm 460 receive individual packages to be stacked from either the package loader 100 or the package loader/unloader 200, and stack the individual packages on the guide fingers 440 of the index plate 420. In addition, holding fingers 482 of the unloading shuttle arm 480 are used to unload the stacked and soldered devices from the guide fingers 440.

The applying unit 500 is used to plate solder flux or solder paste onto the metal leads of the upper packages before they are stacked on the lower packages already loaded in the guide fingers 440 of the index plate 420. The applying unit 500 is provided with a supporting body 530, a fountain 510 containing a molten flux or a molten solder paste, and a roller 520 partially dipped into the applying material and rotating at a constant speed.

Outer leads of the individual packages are plated with a solder alloy such as a tinlead alloy by an outer lead plating process which facilitates soldering and prevents corrosion of the outer leads exposed to the protective package body. When a package device is surface mounted on a printed circuit board, it is common to make the ratio of tin and lead in the solder alloy close to the eutectic point of 63% tin and 37% lead. However, when application of the molten flux or the molten solder paste by the applying unit 500 is followed by soldering of the stacked individual packages for directly joining the metal leads of package devices as in the present invention, a solder alloy of 85% tin and 15% lead is preferably used in the outer lead plating process. When flux is used, flux functions to remove oxide or other surface corrosion from the surface to be joined and prevents oxidation of the metal lead even at an elevated soldering temperature. The flux also promotes wetting of the metallic contacts by the solder, so that liquid solder can spread across the solid metal contacts to be joined. Rosin-based flux or water soluble flux can be used.

On the other hand, if solder paste is used, the solder paste comprises a solder alloy and the flux. If the ratio of tin in the solder paste grows, a higher temperature condition is required during the soldering process.

The operation of the automated stacking and soldering apparatus according to the present invention is as follows.

Individually assembled package devices are tested to confirm the electrical functions, the life time, and the reliability of the devices, and the devices passing the tests are supplied to the stacking and soldering apparatus in trays.

When tray 220 is delivered to a loading position 222 by the package loader/unloader 200, second transfer tool 300b transfers the individual packages contained in the tray 220 to the loading shuttle arm 460 of the indexing system 400. Four individual packages are transferred at a time by the second transfer tool 300b having four vacuum pads 340b. The transferred packages are settled in the holding fingers 462 of the loading shuttle arm 460, and then mounted on the guide fingers 440. The individual packages mounted on the guide fingers 440 will form the lower part of the three dimensional stack package, and are therefore called the lower individual packages.

On the other hand, the upper individual packages are delivered in trays to the loading position 122 by the package loader 100. The first transfer tool 300a transfers the upper individual packages in the loading position 122 to the loading shuttle arm 460 of the indexing system 400. During the transfer of the upper individual packages, metal leads of the packages are plated with flux or solder paste. While the upper individual packages are held by the vacuum pads 340a of the first transfer tool 300a, the upper individual packages are brought into contact with the roller 520 of the applying unit 500, and the molten flux or solder paste is plated to the metal leads by the rotating roller 520.

The upper individual packages are then mounted to the guide fingers 440 of the indexing plate 420 by the loading shuttle arm 460. Because lower individual packages are already settled in the guide fingers 440, it is important to exactly align the upper packages with the lower packages so that corresponding metal leads of the upper and the lower individual packages can accurately contact each other.

The description given above provides details of the step of loading and stacking the individual packages. From the description, it should be understood that these steps are carried out automatically, except for carrying the tested individual packages to the tray and delivering the tray to the package loader 100 and the package loader/unloader 200.

The stacked upper and lower packages in the guide fingers 440 enter into a soldering chamber 610 of the heating unit 600 by rotation of the indexing plate 420. Within the soldering chamber 610, metal leads of the stacked upper and lower packages are heated and solder jointed.

The soldered stacked devices are unloaded from the guide fingers 440 by the unloading shuttle arm 480, and then carried to the tray at the loading position 222 in the package loader/unloader 200 by the second transfer tool 300b. The final stacked and soldered devices are sent from there to a subsequent process, e.g., a test process.

Figure 4:
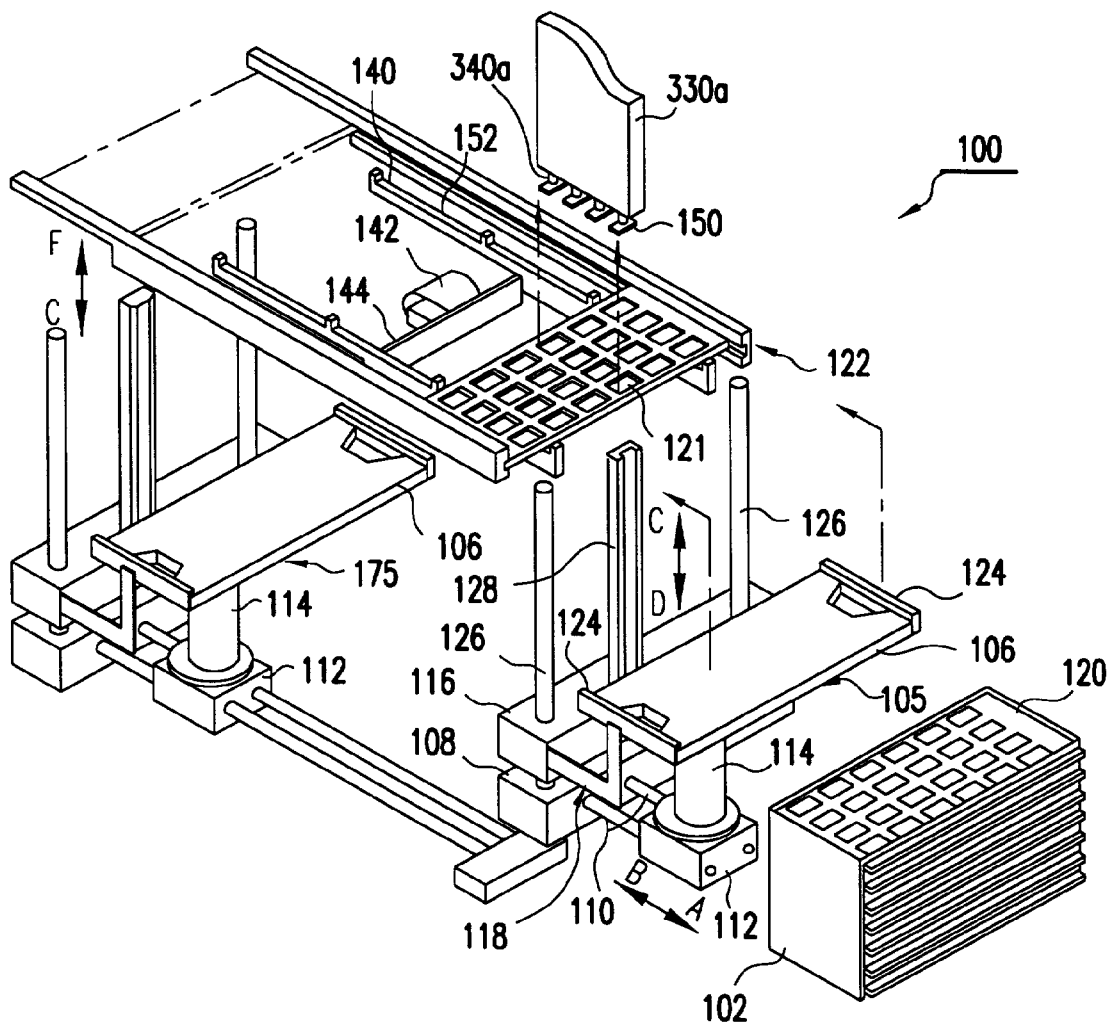
FIG. 4 is a perspective view of a package loader of the automated stacking and soldering apparatus of FIG. 3.

FIG. 4 is a perspective view of the package loader 100 used in the automated stacking and soldering apparatus of the present invention. In a carrier elevating unit 105 of the package loader 100, a carrier 106, onto which one tray 120 is delivered from a tray cassette 102, is connected by a carrier support bar 114 to a carrier feed block 112 moving in the directions indicated by arrow AB. This movement is provided by carrier feed block 112 being connected to a support block 108 by a feed bars 110 so as to allow rectilinear motion of the feed block 112 along the feed bars 110.

In addition, a carrier holding structure 118 comprises a carrier holder for holding two opposing sides of the carrier 106, and moves in the directions indicated by the arrow CD along a guide rail 128. The carrier holding structure 118 is initially supported by a guide block 116. When the carrier holding structure 118 rises in the C direction, it is supported by two vertical guide shafts 126 which are connected to the support block 108 through the guide block 116.

When the tray 120 is located on the loading position 122, the pickup arm 330a transports individual packages 150 contained in grooves 121 of the tray 120. If the pickup arm 330a has four vacuum pads 340a as shown in FIG. 4, four individual packages are simultaneously transferred and loaded onto the loading shuttle arm 460. When all packages contained in the tray 120 are transferred, the empty tray is carried by a conveyor unit 140 along a guide rail 152 in the direction indicated by the arrow E, by a conveyor belt 144 which is driven by an electrical motor 142. The empty tray at the end of the guide rail 152 is unloaded by an empty tray lowering unit 175 moving in the directions indicated by the arrow FG. A detailed description of the empty tray lowering unit 175 is not given here, since it has the same construction as the tray elevating unit 105.

Though the above description is for the package loader 100, the package loader/unloader 200 has a similar structure and operation except that, as explained before, the package loader/unloader 200 functions to load the lower individual packages and unload the stacked and soldered packages which are delivered to the tray 220 at the loading position 222 before the tray 220 is carried by the conveyor unit 140.

Figure 5:
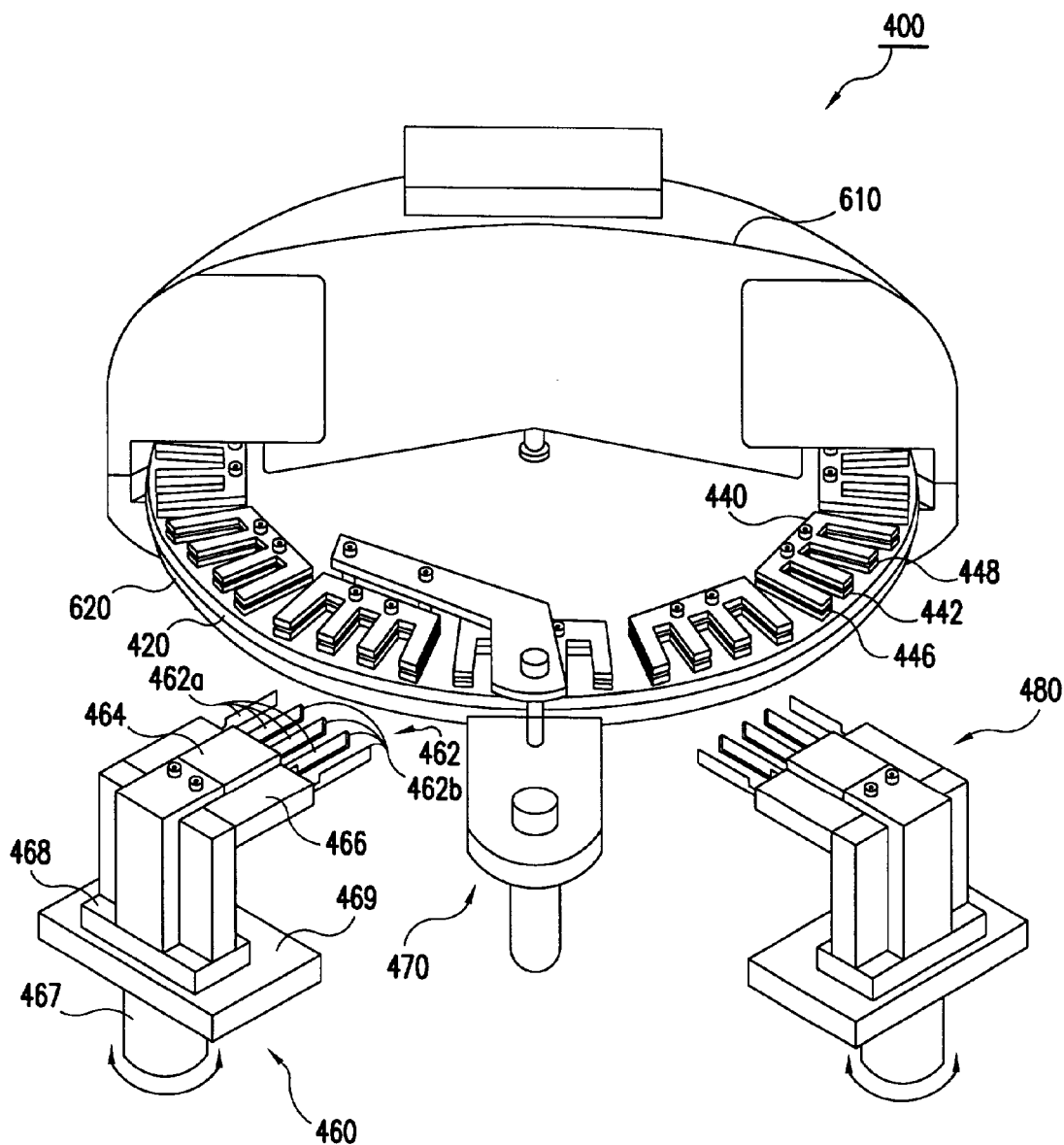
FIG. 5 is a perspective view of an indexing system of the automated stacking and soldering apparatus of FIG. 3.

FIG. 5 is a perspective view of the indexing system used in the automated stacking and soldering apparatus of the present invention. The indexing system 400 comprises an indexing plate 420 to which guide fingers 440 are attached, a loading shuttle arm 460, and an unloading shuttle arm 480. A pushing plate 470 can be used to help align the stacked upper and lower individual packages mounted in the guide fingers 440. However, if the alignment of the stacked packages is acceptably accurate by using the loading shuttle arm 460 and the guide fingers 440, the pushing plate 470 is not used.

When the individual packages are transferred to the loading shuttle arm 460 by the transfer tool 300, they are fixed by the holding fingers 462. The holding fingers 462 comprise first holding fingers 462a coupled to a first holding plate 464 and second holding fingers 462b coupled to a second holding plate 466. Both the holding plates 464 and 466 are fixed to an engaging block 468 for rectilinear motion. The engaging block 468 is coupled to a base plate 469, and the base plate 469 is connected to a rotating shaft 467, which allows the loading shuttle arm 460 to have rectilinear and rotational motion.

Between the first holding fingers 462a and the second holding fingers 462b, there is an elastic element, e.g., a spring (not shown), which tends to push the first and the second holding fingers 462a and 462b together so that there is no gap between them. When the individual packages are to be transferred to the holding fingers by the transfer tool 300a or 300b, the first and second holding plates 464 and 466 slide relative to one another, thereby pushing against the action of the spring so as to open a gap between the holding fingers so that the holding fingers can grip the transferred individual packages by the elastic force of the spring. In order to prevent scratches or damage to the packages, it is desirable to attach a buffer layer such as a silicone to the holding fingers where the individual packages directly contact the holding fingers.

Attached to the indexing plate 420 is a plurality of guide fingers 440, each having four mounting grooves 448 for mounting the individual packages. The guide fingers 440 comprise top blocks 442 and bottom blocks 446. When the upper and lower individual packages are mounted onto the mounting grooves 448 by the loading shuttle arm 460, the top and bottom blocks 442 and 446 are closed to fix the individual packages. At this time, it is important to align the individual packages so that corresponding metal leads of the upper and lower individual packages correctly contact each other.

Figure 6:
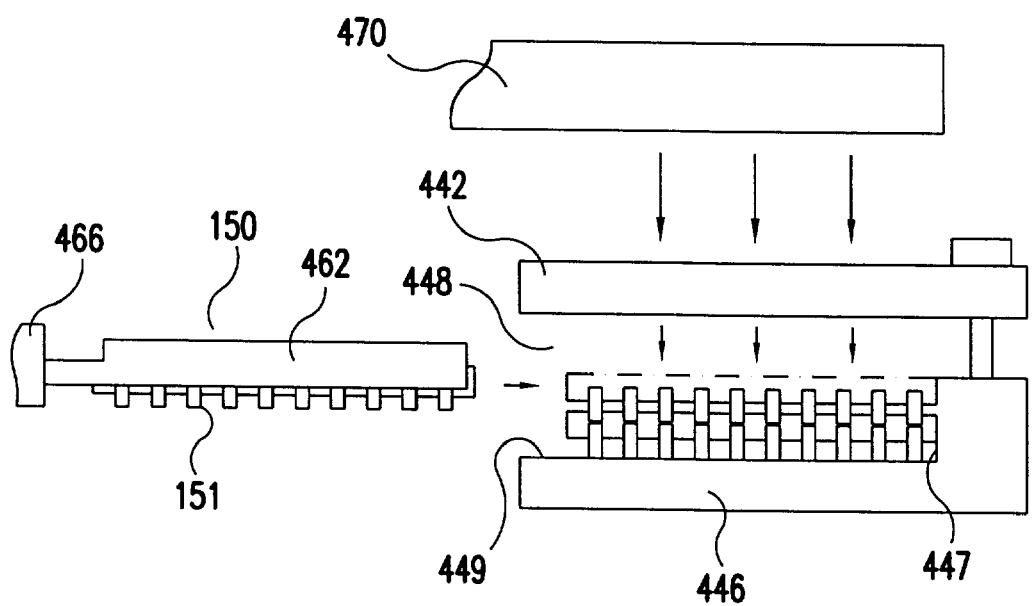
FIG. 6 is a side view illustrating alignment and stacking of the upper and the lower individual packages.

For example, as shown in FIG. 6, four individual packages 150 simultaneously mounted by the loading shuttle arm 460 are aligned in the length direction by pushing one end of each package 150 up against the vertical inside wall 447 of the bottom block 446 when the individual packages 150 are mounted onto the mounting grooves 448. The packages 150 are also aligned in the height direction, because the metal leads 151 of the packages 150 contact the horizontal inside wall 449 of the bottom block 446. In addition, the packages 150 are aligned in the width direction by aligning one end of the holding fingers 462 of the loading shuttle arm 460 with one side end of the bottom block 446 as the packages 150 are mounted onto the mounting grooves 448.

After the alignment and stacking of the individual packages 150, the holding fingers 462 close, and the loading shuttle arm 460 retracts from the mounting grooves 488. The pushing plate 470 pushes the top blocks 442 down to support the aligned and stacked packages.

It should be noted that though the indexing system 400 provided with the loading shuttle arm 460, the unloading shuttle arm 480, and the pushing plate 470 is illustrated in conjunction with the indexing system of FIG. 5, the individual packages can be transferred directly by the transfer tools 300a and 300b to the mounting grooves 448 of the guide fingers 440 from the tray at the loading positions 122 and 222. In this manner, however, the exact alignment of corresponding metal leads of the individual packages may not be possible.

Figure 7:
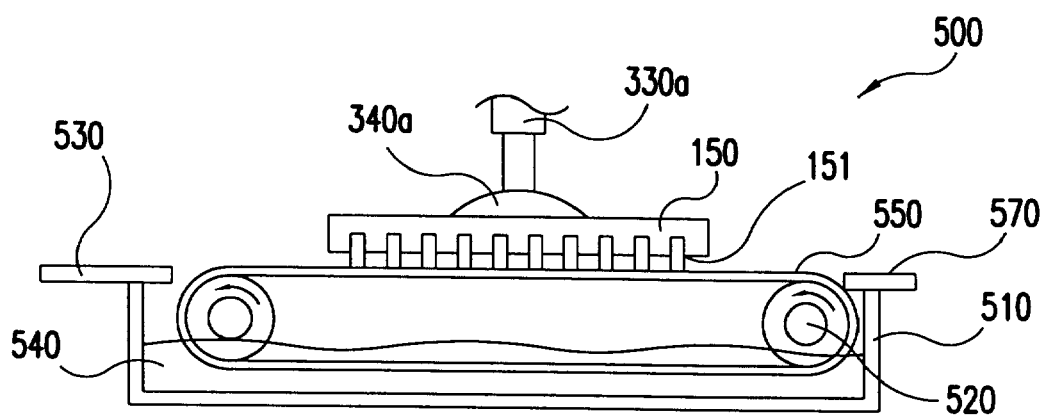
FIG. 7 is a side view of an applying unit of the automated stacking and soldering apparatus of FIG. 3.

FIG. 7 shows a flux or solder paste applying unit 500 suitable for use in the automated stacking and soldering apparatus of the present invention. Molten flux or molten solder paste 540 is contained in the fountain 510. A roller 520 rotates a belt 550 at a constant speed such that the molten material is plated onto the belt 550. A control guide 570 is located adjacent to and slightly spaced from the belt 550 to regulate the amount of molten material plated onto the belt 550. The supporting body 530 is connected to the fountain 510, so that the applying unit 500 is fixed at a certain position, for example between the loading position 122 and the loading shuttle arm 460 as shown in FIG. 3.

When the upper individual packages 150 fixed to the vacuum pads 340a of the pickup arm 330a are positioned over the applying belt 550, the metal leads 151 of the packages touch belt 550, which allows the molten flux or the molten solder paste to be plated onto the metal leads 151. At this time, the rotating roller 520 is temporarily stopped, and after the molten material is plated onto the metal leads, the roller 520 rotates again.

Figure 8:
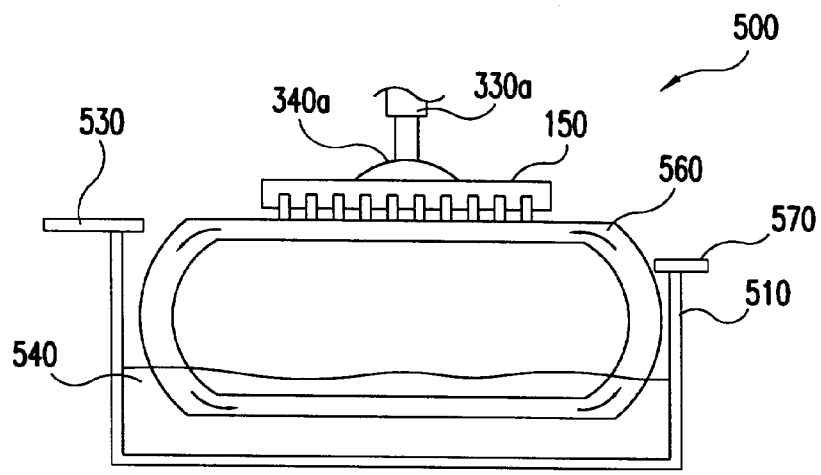
FIG. 8 is a side view of a second embodiment of the applying unit of the automated stacking and soldering apparatus of FIG. 3.

FIG. 8 shows another embodiment of the flux or solder paste applying unit 500 suitable for use in the automated stacking and soldering apparatus of the present invention. The applying unit of FIG. 8 comprises a metal cam 560 in place of the roller 520 and the belt 550. The use of the metal cam 560 can overcome problems such as: the belt loosening after long use, which loosening may make it difficult to regulate the amount of the molten material plated onto the belt; and the molten flux or the solder paste getting onto the rotating axis of the roller or between the roller and the belt and causing the applying unit to malfunction. Since the metal cam 560 has an elliptical cross section as shown in FIG. 8, the control guide 570 moves according to the revolution of the metal cam 560 in order to regulate the amount of molten flux or solder paste plated onto the surface of the metal cam.

The applying units shown in FIGS. 7 and 8 control the roller 520 and the metal cam 560 and each applying unit has a preheater to keep the molten flux or solder paste contained in the fountain 510 from hardening.

The upper individual packages 150 thus plated with molten flux or solder paste are stacked onto the lower individual packages by the guide fingers 440 of the indexing plate 420. The stacked upper and lower individual packages are soldered as they pass through a heating unit 600.

Figure 9:
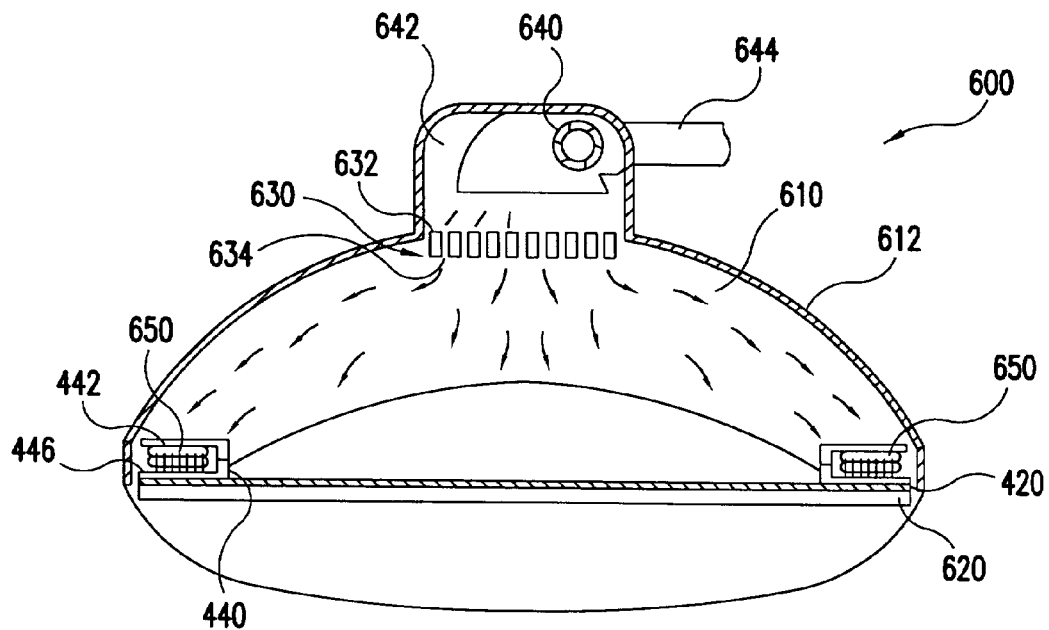
FIG. 9 is a cross sectional-view of a heating unit of the automated stacking and soldering apparatus of FIG. 3.

FIG. 9 shows the heating unit 600 used in the automated stacking and soldering apparatus of the present invention. The stacked individual packages 650 fixed by the top blocks 442 and the bottom blocks 446 of the guide fingers 440 are preheated to a temperature slightly below the soldering temperature by a heating plate 620. This preheating of the stacked packages 650 prevents hardening of the flux or solder paste plated onto the metal leads of the upper individual packages and reduces damage caused by suddenly and rapidly heating the metal leads.

As the heating plate 620 and the indexing plate 420 rotate, the stacked packages 650 contained in the mounting grooves 448 of the guide fingers 440 enter a soldering chamber 610. The soldering chamber 610 is a space defined by a housing 612 where a hot gas flows to heat the metal leads of the individual packages. In design of the soldering chamber 610, it is important to prevent overheating of the joining areas, i.e., the contacted metal leads, by sustaining a constant temperature distribution within the chamber.

A gas supplied through a gas supplying tube 644 passes a ventilator 642 via a fan 640, and then contacts a heater 630. The heater 630 has a metal plate 632 provided with many through holes 634. When the gas passes through the holes 634 of the metal plate 632, the gas is heated to a certain temperature. The hot gas enters the soldering chamber 610 and heats the metal leads of the stacked individual packages 650, so that the metal leads reach the soldering temperature and thus the solder alloy plated onto the metal leads melts and reflows so as to solder joint the corresponding metal leads. In order to prevent the oxidation of metal leads even at high soldering temperatures, the gas must be an inert gas such as a nitrogen gas or an argon gas which does not contain oxygen.

The temperature within the soldering chamber 610 is controlled depending on the ratio of the tin-lead alloy plated or deposited onto the metal leads of the upper and lower individual packages. As the ratio of the tin increases, the melting point of the tin-lead alloy increases and thus the soldering temperature should be raised.

When the temperature within the soldering chamber 610 is controlled to be at 360° C. and the indexing plate 420 is rotated such that the stacked individual packages 650 remain within the soldering chamber 650 for about 100 seconds, about 800 stacked packages are solder jointed in an hour. At this time, the package bodies of the stacked individual packages are heated up to a temperature of about 250° C., and the metal leads are heated up to a temperature of about 340° C.

The manufacturing method for the three dimensional stack package devices is described below, with reference to FIGS. 10 through 16 and centering around the movement of the individual packages.

Figure 10:
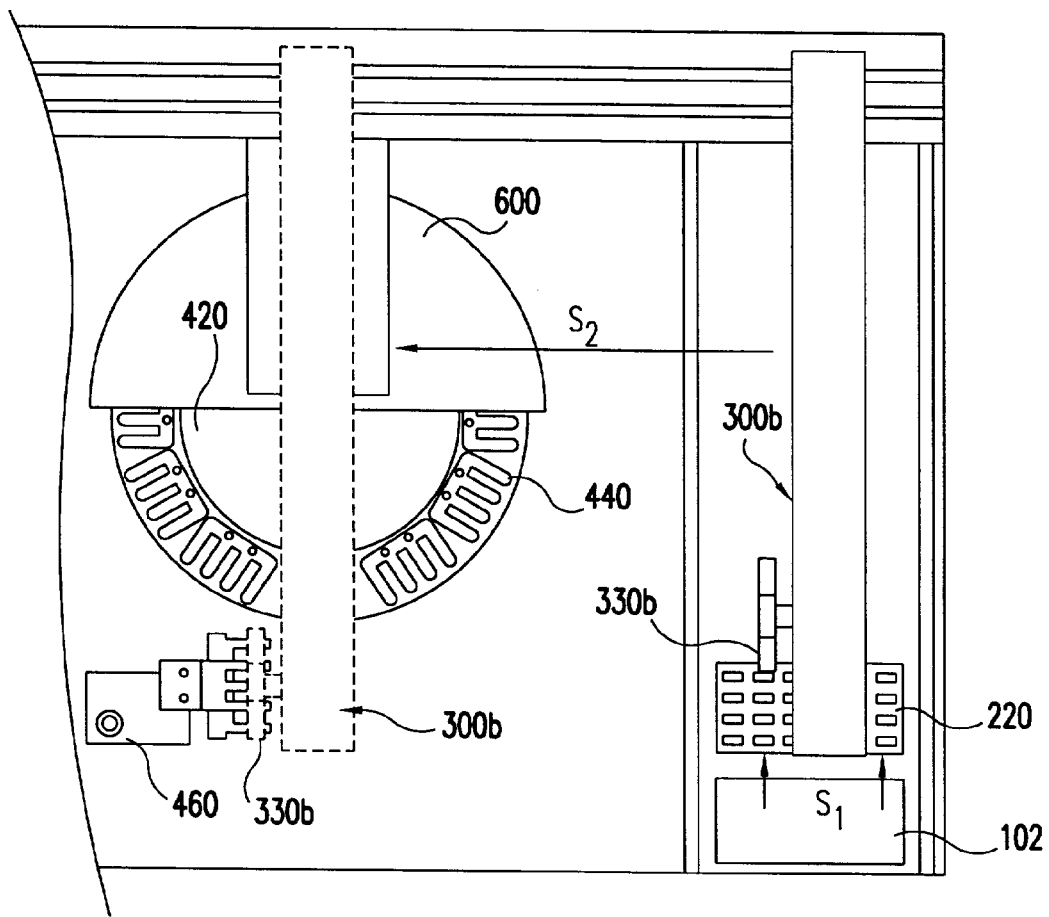
FIG. 10 is a top view illustrating the steps of loading and transferring lower individual packages.

Referring to FIG. 10, the assembled individual packages are loaded from the tray 220 in the tray cassette 102 in step SI. Each of the individual packages loaded in step S1 is transferred to the loading shuttle arm 460 by the second transfer tool 300*b* in step S2. Several individual packages, for example four individual packages, are simultaneously transferred in step S2.

Figure 11:
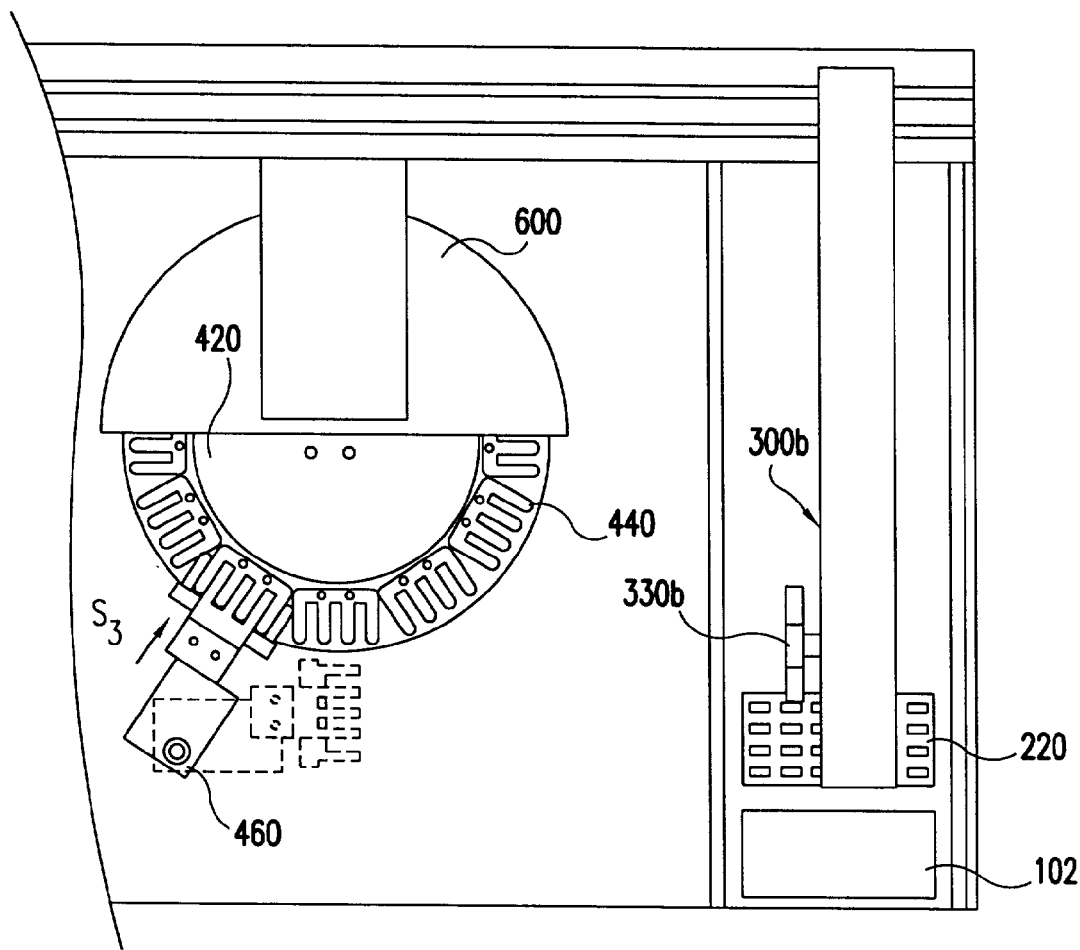
FIG. 11 is a top view illustrating the step of transferring the lower individual packages to the indexing system.

The individual packages in the loading shuttle arm 460 are delivered to the guide fingers 440 of the indexing plate 420 in step S3 as shown in FIG. 11. In the guide fingers 440, the individual packages are placed in positions determined, for example, by the vertical inside wall 447 and the horizontal inside wall 449 of bottom block 446, as described above. In these positions, each of the individual packages will be a lower individual package of a completed three dimensional stacked package.

Figure 12:
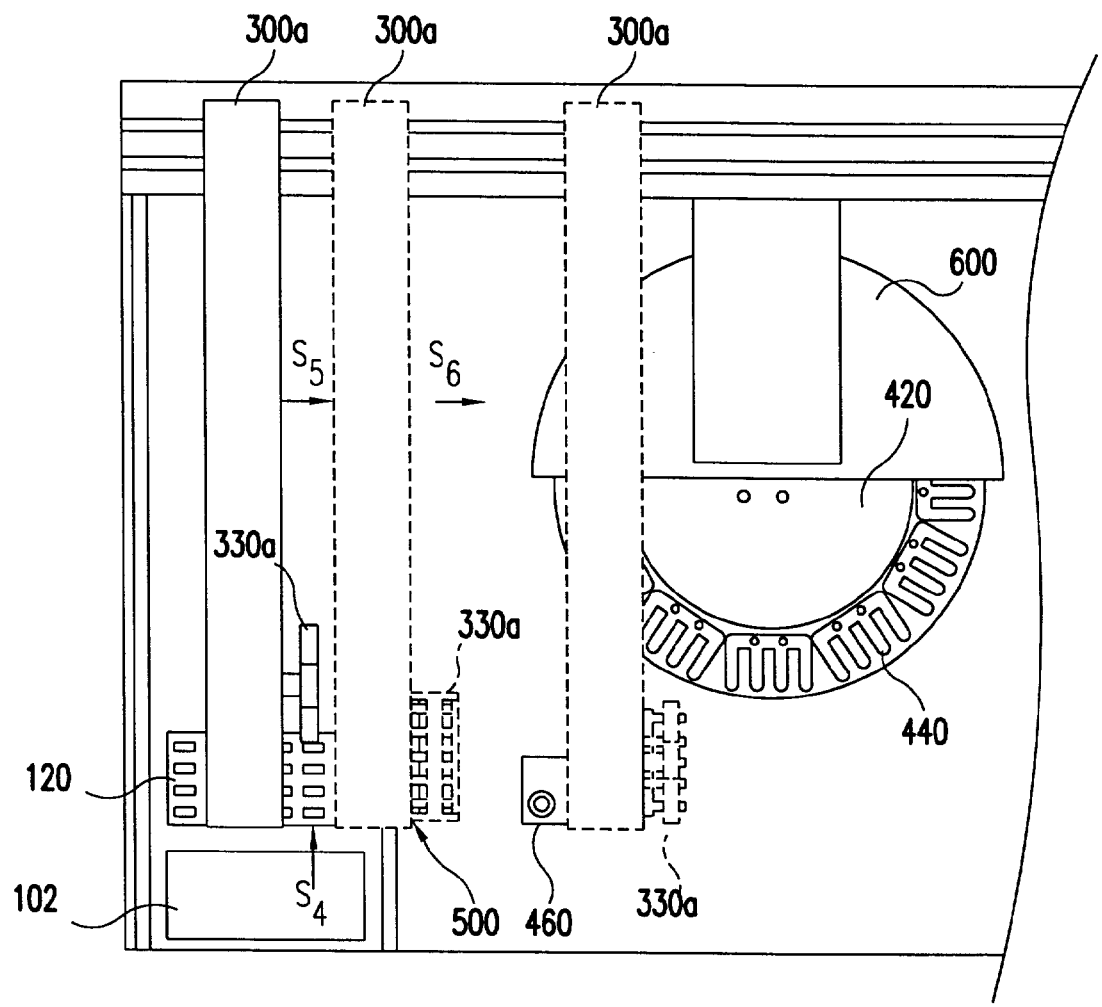
FIG. 12 is a top view illustrating the steps of loading of the upper individual packages, applying molten flux or solder paste to metal leads of the upper individual packages, and transferring the upper individual packages.

FIG. 12 shows steps S4, S5 and S6, in which the upper individual packages are loaded, molten flux or solder paste is applied to the metal leads of the upper individual packages, and the upper individual packages are transferred to the loading shuttle arm 460. First, the upper individual packages are loaded from the tray 120 in the tray cassette 102 in step S4. And then in step S5, the pickup arm 330*a* of first transfer tool 300*a* transfers four upper individual packages to the applying unit 500 to apply molten flux or solder paste to the metal leads of the upper individual packages. The upper individual packages plated with the molten flux or solder paste are delivered to the loading shuttle arm 460 in step S6.

Figure 13:
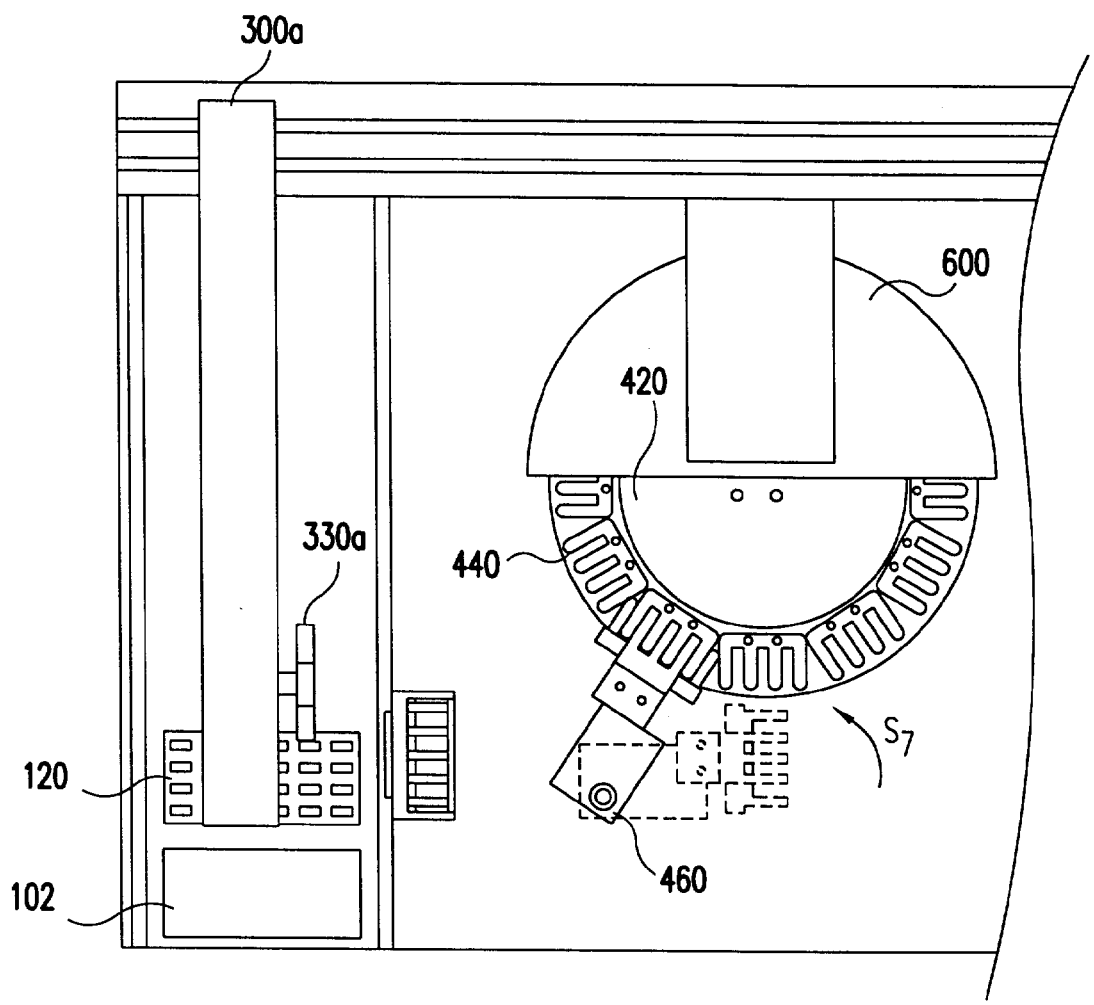
FIG. 13 is a top view illustrating the step of delivering the upper individual packages to the indexing system.
Figure 14:
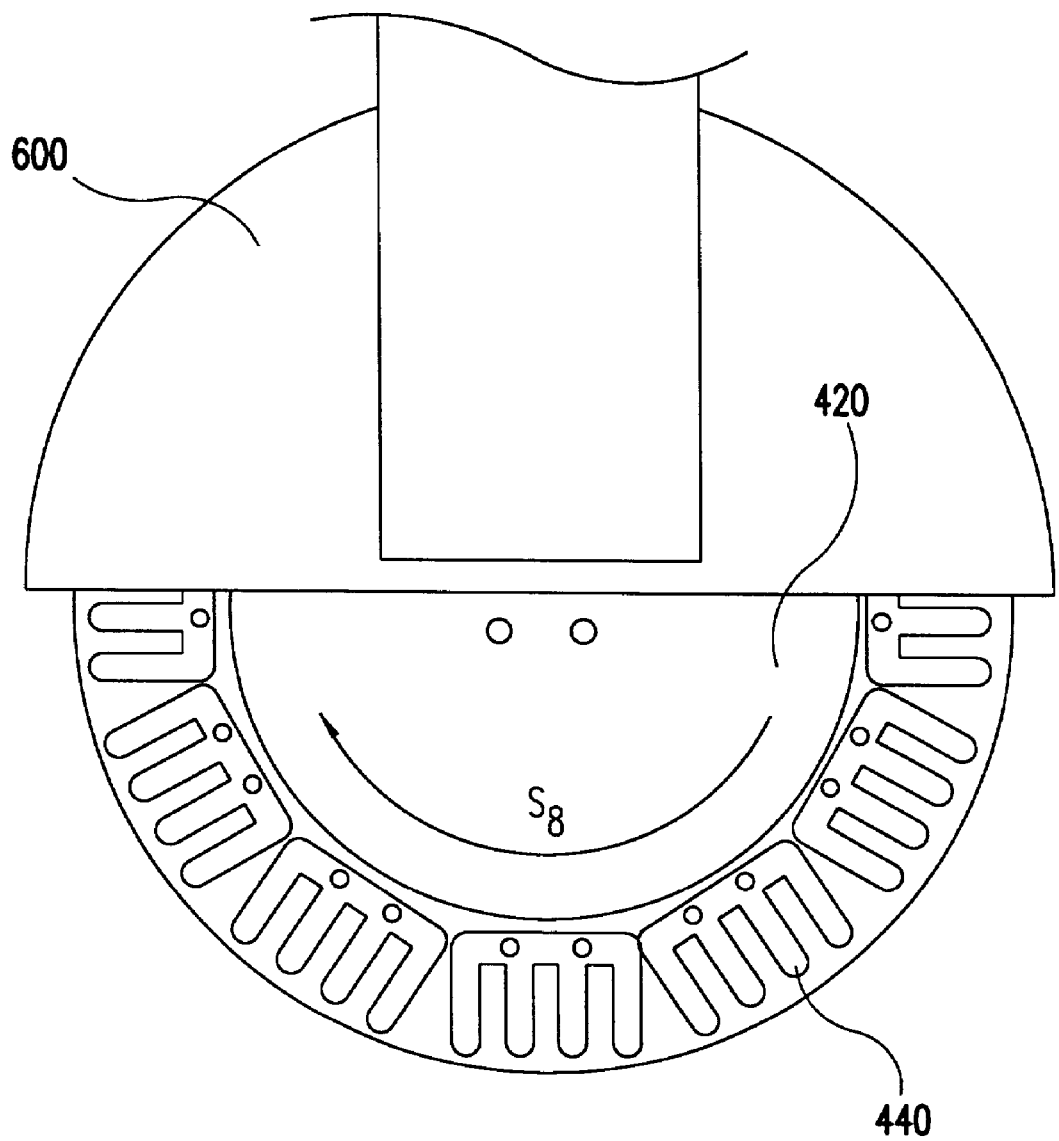
FIG. 14 is a top view illustrating the step of soldering the stacked upper and lower individual packages.

The upper individual packages are transferred to the guide fingers 440 in step S7 as shown in FIG. 13. At this time, the upper individual packages are aligned with the lower individual packages by the loading shuttle arm 460 and the guide fingers 440 so that corresponding metal leads precisely contact each other. When the alignment and the stacking of the upper and the lower individual packages are completed in the guide fingers 440 of the indexing plate 420, the soldering operation is carried out in step S8 as shown in FIG. 14. By rotating the indexing plate 420, the guide fingers 440 in which the stacked individual packages are contained enter the soldering chamber of the heating unit 600.

Figure 15:
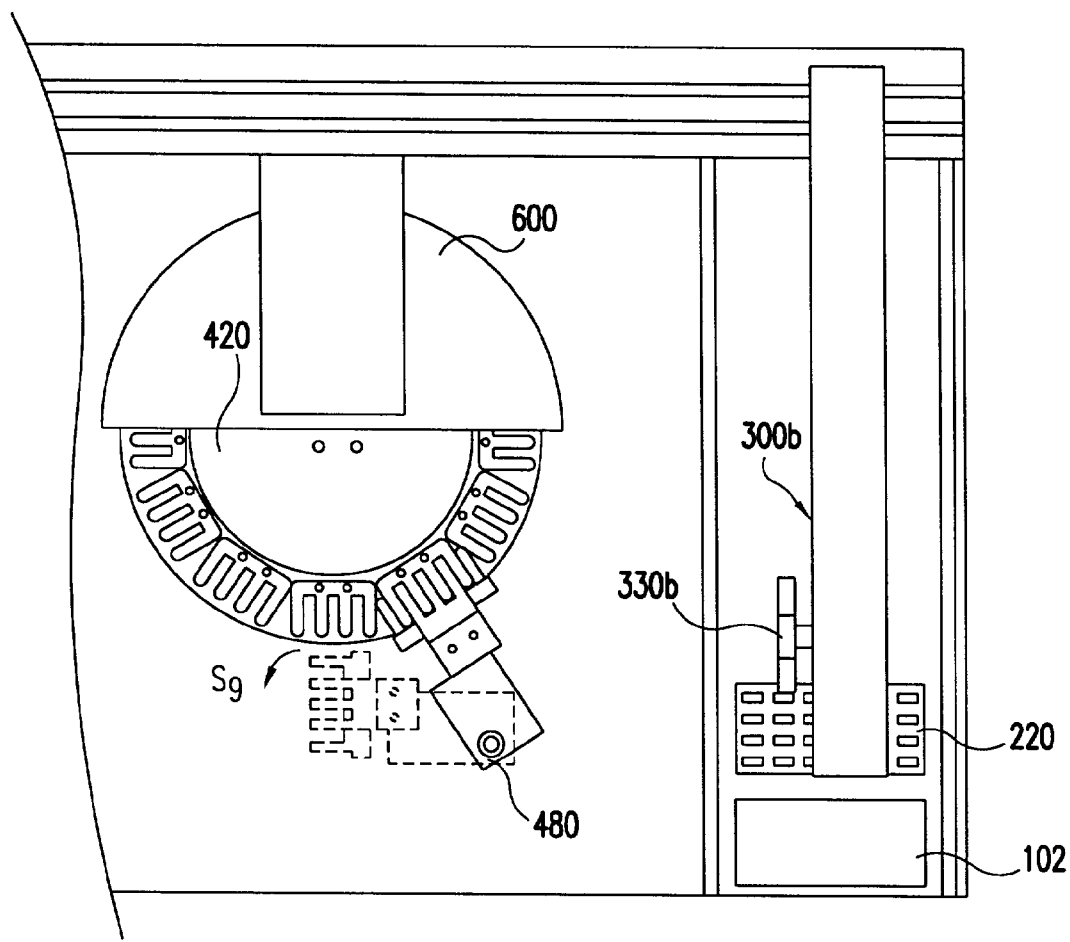
FIG. 15 is a top view illustrating the step of removing the soldered stack packages from the indexing system.

The soldered stacked packages are removed from the guide fingers 440 by the unloading shuttle arm 480 in step S9 as shown in FIG. 15.

Figure 16:
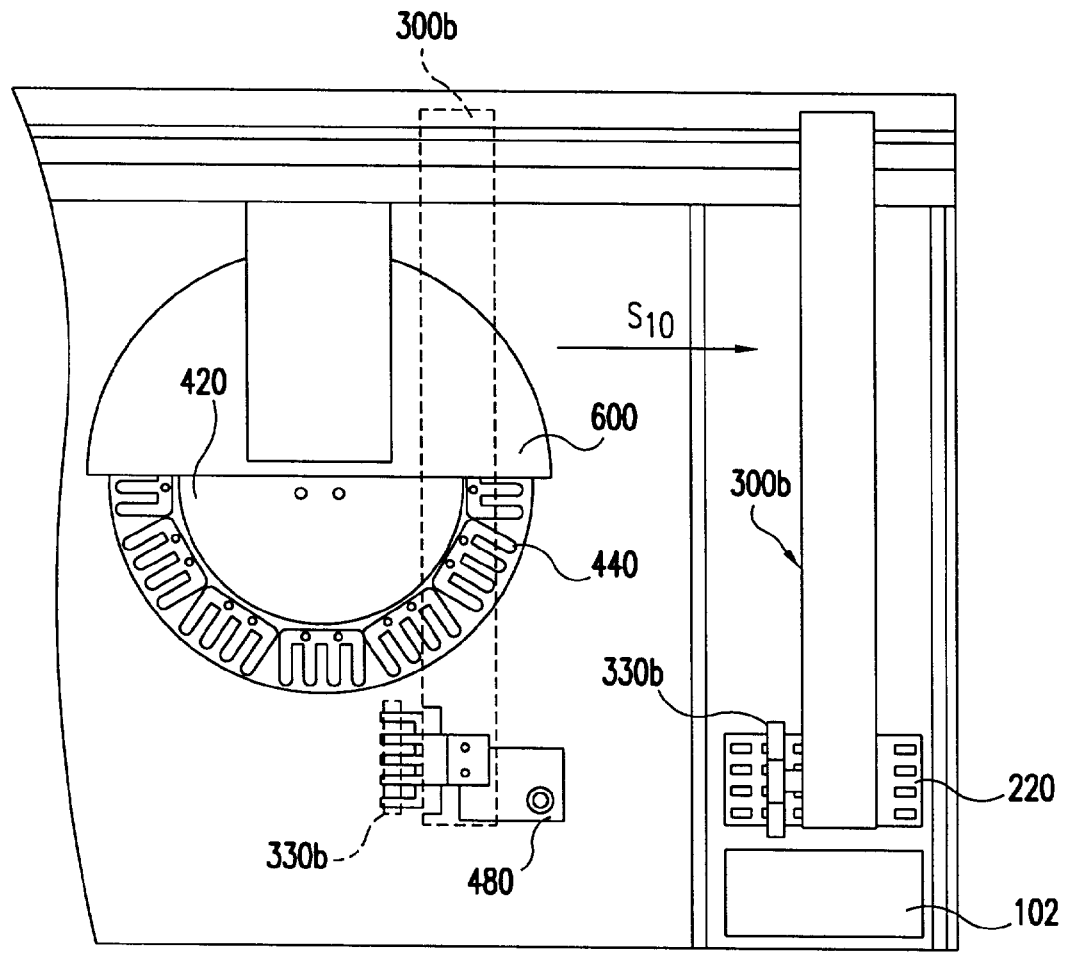
FIG. 16 is a top view illustrating the steps of transferring and unloading the soldered stack packages.

In step S10 shown in FIG. 16, the stacked and soldered three dimensional packages are unloaded from the unloading shuttle arm 480 to the tray 220 by the pickup arm 330*b* of the second transfer tool 300*b*.

The completed devices are delivered as three dimensional stack package devices to customers after testing the electrical characteristics and confirming the reliability of the devices.

As explained so far, with the present invention three dimensional stack packages can be mass produced, because individual packages having a specific lead formation are automatically stacked and solder jointed.

While a preferred embodiment of the present invention has been described, it will be understood by those skilled in the art that various changes and modifications may be made, and equivalents may be substituted for elements thereof without departing from the true scope of the present invention. Therefore, it is intended that the present invention not be limited to the particular embodiment disclosed, but that the present invention include all embodiments falling within the scope of the appended claims.

What is claimed is:

1. An automated stacking and soldering apparatus for three dimensional stack package devices comprising:

a package loader which transfers at one time a plurality of upper individual packages to be stacked to a first loading position in the apparatus;

a package loader/unloader which transfers at one time a plurality of lower individual packages to be stacked to a second loading position in the apparatus and transfers a plurality of three dimensional stack packages which have been stacked and soldered to an unloading position;

an indexing system which receives a predetermined number of upper and lower individual packages and thereafter transports the stacked upper and lower packages, said indexing system comprising a rotary indexing plate mounted in the apparatus so as to be rotatable about a central axis, and a plurality of guide fingers each fixed to the indexing plate at the periphery thereof, said guide fingers comprising a plurality of blocks spaced from one another so as to define a predetermined number of mounting grooves therebetween, each of said mounting grooves sized to accommodate a stack of upper and lower ones of the individual packages;

an applying unit which applies a solder flux or a solder paste to metal leads of said plurality of upper individual packages;

a first transfer tool dedicated to transfer the lower individual packages loaded by the package loader/unloader to the indexing system and to transfer three dimensional stack package devices from said indexing system to said package loader/unloader, said first transfer tool including a plurality of first grippers capable of gripping a row of lower individual packages at one time at the second loading position, and at least one movable master arm to which said first grippers are connected, said at least one movable master arm providing said first grippers with a working range encompassing said second loading position to which the lower individual packages are transferred;

a second transfer tool dedicated to transfer the upper individual packages loaded by the package loader to the applying unit and then to the indexing system, said second transfer tool including a plurality of second grippers capable of gripping a row of upper individual packages at one time at said first loading position, and at least one movable master arm to which said second grippers are connected, said at least one movable master arm of the second transfer tool providing said second grippers with a working range encompassing said first loading position to which the upper packages are transferred and said applying unit; and a heating unit confronting said rotary indexing plate, at the periphery thereof, so as to heat the stacked upper and lower packages transported by the indexing system, so that metal leads of the upper and lower packages are solder jointed.

2. An automated stacking and soldering apparatus for three dimensional stack package devices comprising:

a package loader which transfers at one time a plurality of upper individual packages to be stacked to a first loading position in the apparatus;

a package loader/unloader which transfers at one time a plurality of lower individual packages to be stacked to a second loading position in the apparatus and transfers a plurality of three dimensional stack packages which have been stacked and soldered to an unloading position;

an indexing system which receives a predetermined number of upper and lower individual packages and thereafter transports the stacked upper and lower packages, said indexing system comprising a rotary indexing plate mounted in the apparatus so as to be rotatable about a central axis, a plurality of guide fingers each fixed to the indexing plate at the periphery thereof, said guide fingers comprising a plurality of blocks spaced from one another so as to define a predetermined number of mounting grooves in which said individual packages are mounted, a loading shuttle arm which places a number of upper individual packages onto a same number of lower individual packages mounted to said rotary indexing plate in the mounting grooves of the guide fingers, said loading shuttle arm having a plurality of holding fingers configured to hold a plurality of individual packages and cooperate with the mounting grooves of said guide fingers, and a driving mechanism which moves said holding fingers of the loading shuttle arm toward and away from the periphery of said rotary indexing plate, and an unloading shuttle arm which removes stacked and soldered upper and lower individual packages from the mounting grooves of the guide fingers, said unloading shuttle arm having a plurality of holding fingers configured to hold a plurality of individual packages and cooperate with the mounting grooves of said guide fingers, and a driving mechanism which moves said holding fingers of the unloading shuttle arm toward and away from the periphery of said rotary indexing plate;

an applying unit which applies a solder flux or a solder paste to metal leads of said plurality of upper individual packages;

a first transfer tool dedicated to transfer the lower individual packages loaded by the package loader/unloader to the loading shuttle arm of the indexing system, said first transfer tool including a plurality of first grippers capable of gripping a row of lower individual packages at one time at the second loading position, and at least one movable master arm to which said first grippers are connected, said at least one movable master arm providing said first grippers with a working range encompassing said second loading position to which the lower individual packages are transferred and said loading shuttle arm;

a second transfer tool dedicated to transfer the upper individual packages loaded by the package loader to the applying unit and then to the loading shuttle arm of the indexing system, said second transfer tool including a plurality of second grippers capable of gripping a row of upper individual packages at one time at said first loading position, and at least one movable master arm to which said second grippers are connected, said at least one movable master arm of the second transfer tool providing said second grippers with a working range encompassing said first loading position to which the upper packages are transferred, said applying unit, and said loading shuttle arm; and a heating unit confronting said rotary indexing plate, at the periphery thereof, so as to heat the stacked upper and lower packages transported by the indexing system, so that metal leads of the upper and lower packages are solder jointed.

3. The automated stacking and soldering apparatus as claimed in claim 2, wherein the driving mechanism of each of said loading shuttle arm and the unloading shuttle arm comprises a rectilinear drive and a rotary drive.

4. The automated stacking and soldering apparatus as claimed in claim 3, wherein the holding fingers comprise first fingers and second fingers coacting with said first fingers, and a buffer layer at surfaces which contact the individual packages.

5. The automated stacking and soldering apparatus as claimed in claim 2, wherein the blocks of said guide fingers comprise top blocks and bottom blocks spaced vertically from each other so as to define the mounting grooves, said bottom blocks having vertical inside walls which contact ends of the upper and lower individual packages, and horizontal inside walls which contact metal leads of the lower individual packages, when the upper and lower individual packages are loaded into the mounting grooves by the loading shuttle arm.

6. The automated stacking and soldering apparatus as claimed in claim 5, wherein said indexing system further comprises a pushing plate which pushes each of the top blocks down when the upper and lower individual packages are mounted in the mounting grooves, so that corresponding metal leads of the upper and lower individual packages contact each other.

7. The automated stacking and soldering apparatus as claimed in claim 2, wherein said applying unit comprises a fountain containing a molten flux or a molten solder paste, a rotating belt onto which the molten flux or molten solder paste is plated, a rotating roller for rotating the rotating belt, and a control guide for maintaining a constant amount of the molten flux or molten solder paste on the rotating belt.

8. The automated stacking and soldering apparatus as claimed in claim 7, wherein said rotating roller stops temporarily while metal leads of the upper individual packages are plated with the molten flux or molten solder paste by the second transfer means.

9. The automated stacking and soldering apparatus as claimed in claim 7, wherein the applying unit further comprises a pre-heater for heating the fountain so that the molten flux or molten solder paste maintains its molten state.

10. The automated stacking and soldering apparatus as claimed in claim 2, wherein said applying unit comprises a fountain containing a molten flux or a molten solder paste, a rotating metal cam onto which the molten flux or molten solder paste is plated, and a control guide for maintaining a constant amount of the molten flux or molten solder paste on the rotating metal cam.

11. The automated stacking and soldering apparatus as claimed in claim 10, wherein said rotating metal cam stops temporarily while metal leads of the upper individual packages are plated with the molten flux or molten solder paste by the second transfer means.

12. The automated stacking and soldering apparatus as claimed in claim 10, wherein the applying unit further comprises a pre-heater for heating the fountain so that the molten flux or molten solder paste maintains its molten state.

13. The automated stacking and soldering apparatus as claimed in claim 2, wherein said grippers are vacuum pads which pick up said individual packages using suction.

14. The automated stacking and soldering apparatus as claimed in claim 2, wherein each of said package loader and said package loader/unloader comprises a carrier configured to support a tray in which individual packages to be stacked are contained, and an elevator which delivers the carrier to the respective loading position thereof.

15. The automated stacking and soldering apparatus as claimed in claim 2, wherein the heating unit comprises a ventilator for supplying an inert gas, a heater for heating the inert gas from the ventilator, and a soldering chamber into which the heated inert gas is supplied and through which the guide fingers containing the stacked individual packages passes.

* * * * *